(12) United States Patent
Rathert et al.

(10) Patent No.: US 10,867,877 B2
(45) Date of Patent: Dec. 15, 2020

(54) TARGETED RECALL OF SEMICONDUCTOR DEVICES BASED ON MANUFACTURING DATA

(71) Applicant: KLA-Tencor Corporation, Milpitas, CA (US)

(72) Inventors: Robert J. Rathert, Mechanicsville, VA (US); David W. Price, Austin, TX (US)

(73) Assignee: KLA Corporation, Milpitas, CA (US)

( * ) Notice: Subject to any disclaimer, the term of this patent is extended or adjusted under 35 U.S.C. 154(b) by 0 days.

(21) Appl. No.: 16/038,973

(22) Filed: Jul. 18, 2018

(65) Prior Publication Data
US 2019/0295908 A1 Sep. 26, 2019

Related U.S. Application Data

(60) Provisional application No. 62/645,406, filed on Mar. 20, 2018.

(51) Int. Cl.
*H01L 21/66* (2006.01)
*G06Q 30/00* (2012.01)
*G01R 31/28* (2006.01)

(52) U.S. Cl.
CPC .......... *H01L 22/34* (2013.01); *G01R 31/2831* (2013.01); *G06Q 30/014* (2013.01); *H01L 22/12* (2013.01)

(58) Field of Classification Search
CPC ......... H01L 22/10; H01L 22/26; G01N 21/94; G01N 21/956; G01R 31/2831; G01R 31/2894; G06K 9/4604

(Continued)

(56) References Cited

U.S. PATENT DOCUMENTS

2005/0021303 A1* 1/2005 Matsushita .......... G11C 29/006
                                                           702/185
2006/0234496 A1 10/2006 Zhao et al.
(Continued)

FOREIGN PATENT DOCUMENTS

JP          2011226989 A      11/2011

OTHER PUBLICATIONS

"Guidelines for Part Average Testing", Automotive Electronics Council Component Technical Committee, AEC-Q001 Rev-D, Dec. 9, 2011, 12 pages.

(Continued)

*Primary Examiner* — Jonathan Han
(74) *Attorney, Agent, or Firm* — Suiter Swantz pc llo

(57) ABSTRACT

A system for providing a targeted recall includes a metrology sub-system for performing in-line measurements on semiconductor dies after one or more fabrication steps to generate in-line measurement profiles, a failure analysis sub-system for determining a manufacturing fingerprint of a failed die, and a controller. The metrology sub-system may further perform one or more measurements of the semiconductor dies after one or more packaging steps to generate package characterization profiles. The controller may generate manufacturing fingerprints for the semiconductor dies based on the in-line measurement profiles and the package characterization profiles, which are referenced to unique electronic chip identifiers. The controller may further identify at-risk dies by comparing the manufacturing fingerprints of the semiconductor dies with the manufacturing fingerprint of the failed die and direct a targeted recall for the one or more at-risk dies.

29 Claims, 7 Drawing Sheets

(58) Field of Classification Search
USPC ............... 382/141, 149; 356/237.5; 700/110;
702/185; 716/54
See application file for complete search history.

(56) References Cited

U.S. PATENT DOCUMENTS

| | | | |
|---|---|---|---|
| 2009/0220142 A1* | 9/2009 | Matsushita | G06K 9/4604 |
| | | | 382/149 |
| 2010/0063619 A1* | 3/2010 | Tsai | G01N 21/956 |
| | | | 700/213 |
| 2010/0303334 A1 | 12/2010 | Kitamura et al. | |
| 2013/0288403 A1* | 10/2013 | Chen | H01L 22/20 |
| | | | 438/16 |
| 2014/0328534 A1 | 11/2014 | Lin et al. | |
| 2016/0370300 A1* | 12/2016 | Ogawa | G01N 21/8851 |
| 2018/0275189 A1 | 9/2018 | Price et al. | |

OTHER PUBLICATIONS

International Search Report dated Jul. 3, 2019 for PCT/US2019/022833.

* cited by examiner

TARGETED RECALL OF SEMICONDUCTOR DEVICES BASED ON MANUFACTURING DATA

CROSS-REFERENCE TO RELATED APPLICATION

The present application claims the benefit under 35 U.S.C. § 119(e) of U.S. Provisional Application Ser. No. 62/645,406, filed Mar. 20, 2018, entitled METHOD TO ENABLE TARGETED RECALL LOF AT RISK SEMICONDUCTOR DEVICES USING HOLISTIC MANUFACTURING DATA AND MACHINE LEARNING, naming Robert J. Rathert and David W. Price as inventors, which is incorporated herein by reference in the entirety.

TECHNICAL FIELD

The present disclosure is related to recalls of semiconductor devices and, more particularly, to target recalls of semiconductor devices based on manufacturing data.

BACKGROUND

Product recalls due to failures of semiconductor devices are typically costly and disruptive for both businesses and consumers. It is thus desirable to limit recalls to semiconductor devices that are expected to fail in order to mitigate the associated cost and disruption. Typical product recalls are based on gross attributes associated with a failed device such as location and time window of fabrication. However, such blanket recalls may be inefficient or ineffective at preventing the same or similar types of failures in the future.

Failure of a semiconductor device is typically associated with a convergence of multiple factors including, but not limited to defects in manufacturing and operational conditions. In practice, a given semiconductor device may be fabricated in any of multiple fabrication locations and may further be exposed to diverse operating conditions such as, but not limited to, temperature, humidity, vibration, electronic overstress (EOS), or electrostatic discharge (ESD) conditions. Accordingly, accurately predicting device failures to provide targeted recalls remains an ongoing challenge.

SUMMARY

A system for providing a targeted recall is disclosed in accordance with one or more illustrative embodiments of the present disclosure. In one illustrative embodiment, the system includes a metrology sub-system for performing in-line measurements on semiconductor dies after one or more fabrication steps to generate in-line measurement profiles. In another illustrative embodiment, the metrology sub-system performs one or more measurements of the semiconductor dies after one or more packaging steps to generate package characterization profiles. In another illustrative embodiment, the system includes a failure analysis sub-system for determining at least a portion of a manufacturing fingerprint of a failed die. In another illustrative embodiment, the system includes a controller. In another illustrative embodiment, the controller generates manufacturing fingerprints for the semiconductor dies based on the in-line measurement profiles and the package characterization profiles of the semiconductor dies. In another illustrative embodiment, the manufacturing fingerprints are referenced to unique electronic chip identifiers for the semiconductor dies. In another illustrative embodiment, the controller identifies one or more at-risk dies based on comparisons of manufacturing fingerprints of the semiconductor dies with the at least a portion of the manufacturing fingerprint of the failed die. In another illustrative embodiment, the controller directs a targeted recall for the one or more at-risk dies.

A method for providing a targeted recall is disclosed in accordance with one or more illustrative embodiments of the present disclosure. In one illustrative embodiment, the method includes performing in-line measurements on semiconductor dies after one or more semiconductor fabrication steps to generate in-line measurement profiles. In another illustrative embodiment, the method includes performing one or more measurements of the semiconductor after one or more packaging steps to generate package characterization profiles. In another illustrative embodiment, the method includes generating manufacturing fingerprints for the semiconductor dies based on the in-line measurement profiles and the package characterization profiles. In another illustrative embodiment, the manufacturing fingerprints are referenced to unique electronic chip identifiers for the semiconductor dies. In another illustrative embodiment, the method includes determining at least a portion of the manufacturing fingerprint of a failed die of the plurality of dies. In another illustrative embodiment, the method includes identifying one or more at-risk dies of the plurality of dies based on comparisons of manufacturing fingerprints of the plurality of dies with the at least a portion of the manufacturing fingerprint of the failed die. In another illustrative embodiment, the method includes recalling devices including the one or more at-risk dies.

A system for providing a targeted recall is disclosed in accordance with one or more illustrative embodiments of the present disclosure. In one illustrative embodiment, the system includes a controller communicatively coupled to a metrology sub-system and a failure analysis sub-system. In another illustrative embodiment, the controller generates manufacturing fingerprints for semiconductor dies based on in-line measurement profiles of the semiconductor dies received from the metrology sub-system after one or more semiconductor fabrication steps and further based on package characterization profiles of the semiconductor dies received from the metrology sub-system after one or more packaging steps. In another illustrative embodiment, the manufacturing fingerprints are referenced to unique electronic chip identifiers for the semiconductor dies. In another illustrative embodiment, the controller identifies one or more at-risk dies based on comparisons of manufacturing fingerprints of the semiconductor dies with at least a portion of a manufacturing fingerprint of the failed die received from the failure analysis sub-system. In another illustrative embodiment, the controller directs a targeted recall for the one or more at-risk dies.

It is to be understood that both the foregoing general description and the following detailed description are exemplary and explanatory only and are not necessarily restrictive of the invention as claimed. The accompanying drawings, which are incorporated in and constitute a part of the specification, illustrate embodiments of the invention and together with the general description, serve to explain the principles of the invention.

BRIEF DESCRIPTION OF DRAWINGS

The numerous advantages of the disclosure may be better understood by those skilled in the art by reference to the accompanying figures in which.

DETAILED DESCRIPTION

Figure 1A:
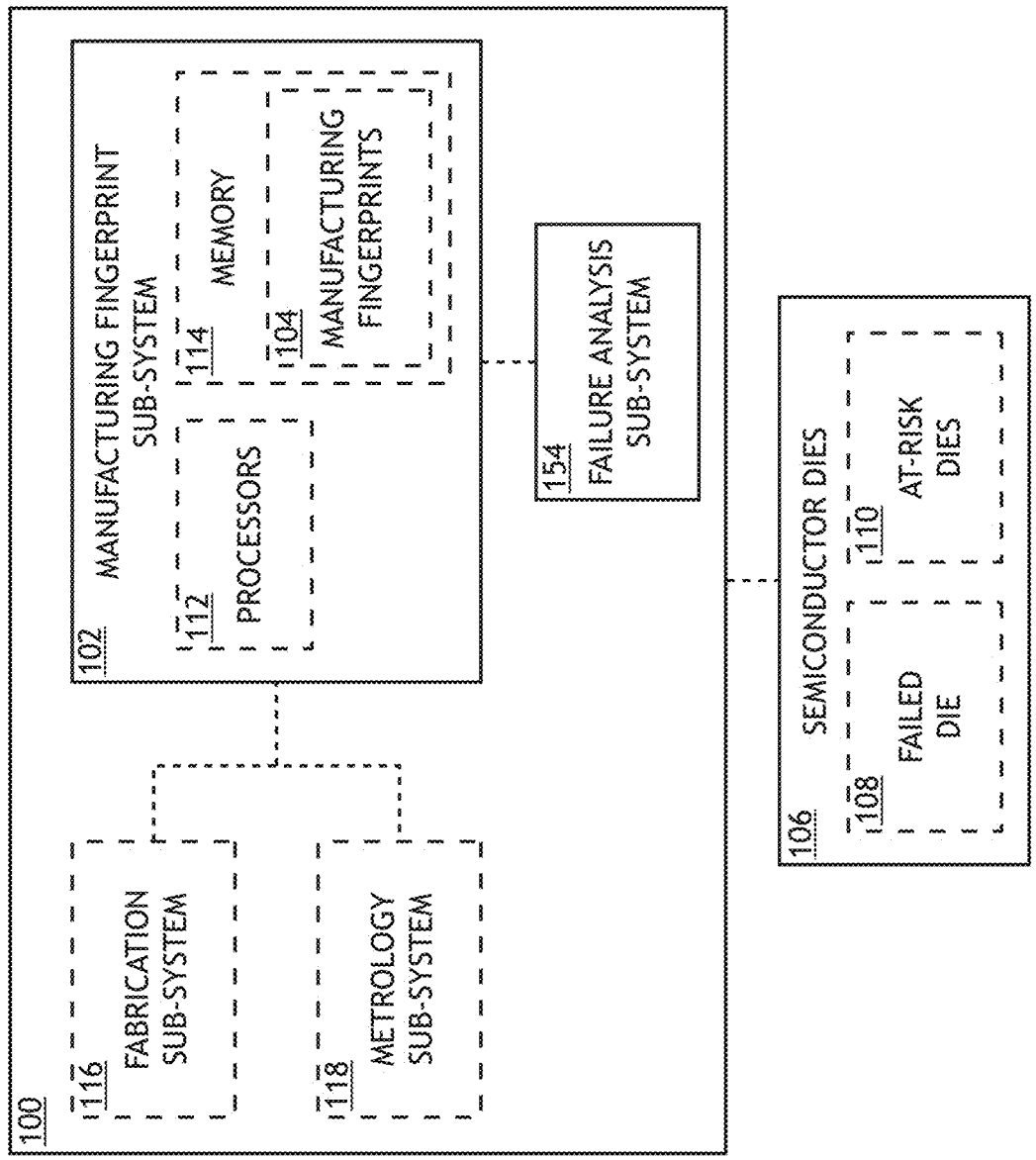
FIG. 1A is a conceptual view of a system for providing targeted recalls, in accordance with one or more embodiments of the present disclosure.

Reference will now be made in detail to the subject matter disclosed, which is illustrated in the accompanying drawings. The present disclosure has been particularly shown and described with respect to certain embodiments and specific features thereof. The embodiments set forth herein are taken to be illustrative rather than limiting. It should be readily apparent to those of ordinary skill in the art that various changes and modifications in form and detail may be made without departing from the spirit and scope of the disclosure.

Embodiments of the present disclosure are directed to systems and methods for providing targeted recalls of semiconductor devices based on holistic manufacturing data.

In some embodiments, manufacturing fingerprints (e.g., fingerprints) are developed to consolidate and/or track data relevant to the manufacturing history of semiconductor devices such as, but not limited to, fabrication profiles, in-line measurement profiles, package test profiles, or burn-in profiles. Upon a device failure (e.g., a failure of a device operating in the field), at least a partial fingerprint of the failed device may be extracted. Then, a targeted recall may include only semiconductor devices having fingerprints similar to the failed device. In this regard, a targeted recall may utilize device-specific manufacturing data to identify a subset of semiconductor devices having similar defect and/or test profiles that are likely to fail under similar conditions as the failed device.

In some embodiments, manufacturing fingerprints include fabrication profile data suitable for identifying various conditions associated with fabrication. For example, fabrication profile data may include a fabrication location such as a fabrication facility, a fabrication line within a fabrication facility, or the like. By way of another example, fabrication profile data may include a fabrication time or time window. By way of another example, fabrication profile data may include granular information relevant to the specific wafer, the specific die on a wafer, the specific location within a die, or the like. For instance, fabrication profile data may include granular information such as, but not limited to, a lot identifier, a wafer identifier, or a die location on a wafer (e.g., in X-Y coordinates, in polar coordinates, or the like). By way of another example, fabrication an electronic ID (ECID) unique to each device.

It is recognized herein that fabrication profile data may be insufficient and/or at times a poor predictor of failure rates of semiconductor devices. For example, product recalls based solely on fabrication profile data assume that devices fabricated in the same location at a time temporally proximate to a failed device will have similar failure rates as the failed device. However, it may be the case that operational conditions of devices identified by these gross characteristics may differ. For example, semiconductor devices from the same fabrication facility and in some cases the same lot as the failed device may be integrated into different components and exposed to different operational conditions. Accordingly, a product recall based solely on fabrication profile data may include semiconductor devices unlikely to fail under actual operating conditions for those devices. Further, a product recall based solely on fabrication profile data may not include semiconductor devices fabricated in other lots or other facilities that nonetheless have similar manufacturing histories and may be subjected to similar operational conditions as the failed device such that they exhibit a high likelihood of failure.

In some embodiments, manufacturing fingerprints include in-line measurement profile data (e.g., defect profile data, metrology profile data, inspection profile data, or the like). It is recognized herein that the presence of manufacturing defects (e.g., deviations from design specifications) and/or contaminants may lead to device failure. Accordingly, a fingerprint including in-line measurement profile data may facilitate the identification of semiconductor devices that are susceptible to the same or similar defect-based failure mechanisms as the failed device. For example, a semiconductor fabrication process may include a series of metrology steps to characterize, monitor, and/or control the fabrication process. For instance, a semiconductor fabrication process may include inspection steps to identify defects associated with the introduction of contaminants, deviations of fabricated features from target values, or the like. In another instance, a semiconductor fabrication process may include overlay metrology steps to determine the relative positions of successively-fabricated layers. Accordingly, the fingerprints may include the metrology results associated with a wafer and/or a die at any point during fabrication.

In some embodiments, manufacturing fingerprints include testing profile data. Semiconductor wafers typically include multiple dies distributed across the wafer devices to fabricate multiple devices in parallel. After fabrication, wafers may be diced and each die may be packaged alone or with additional components to form semiconductor devices. Packaged components (or partially-packaged components) are then commonly subjected to various tests such as, but not limited to, connection tests to characterize electrical and/or mechanical connections between various components, functionality tests to determine whether the device functions within selected specifications, or burn-in tests in which components are subjected to a variety of stresses to screen devices for failure under various operational conditions. It is recognized herein that devices having similar testing profiles may be susceptible to the same or similar operational-condition-based failure mechanisms as the failed device. Accordingly, the fingerprints may include the test results associated with packaged or partially-packaged devices.

In some embodiments, manufacturing fingerprints include expected operational profile data. It is recognized herein that whether a given semiconductor device is exposed to the same or similar operating conditions as the failed device may influence the expected likelihood of failure. For example, it may be the case that an expected operational environment (e.g., temperature, pressure, EOS, EDS, or the like) and/or the intended use (e.g., an airline cockpit, an automobile, a consumer electronic device, or the like) is known at the time of manufacture. Accordingly, fingerprints may include the expected operational conditions.

In some embodiments, manufacturing fingerprints associated with the same or similar types of semiconductor devices are stored in a format that facilitates search and correlation analysis of the various data within the fingerprints. For example, the fingerprints may be stored in a searchable database. By way of another example, the fingerprints may be stored in a system suitable for correlations using machine learning techniques.

In some embodiments, upon a device failure, a full or a partial fingerprint is extracted for the failed device. For example, a full fingerprint may be known if the full manufacturing fingerprint for the particular failed device was generated and stored. By way of another example, a full or a partial fingerprint may be extracted based on a failure analysis of an unknown or unidentifiable part.

In some embodiments, a subset of semiconductor devices may be identified as part of a targeted recall based on a comparative analysis of a fingerprint (or at least a partial fingerprint) of a failed device with stored fingerprints. The comparative analysis may include any technique known in the art suitable for identifying semiconductor devices likely to fail under similar operational conditions as the failed device. For example, a comparative analysis may include, but is not required to include, a "nearest-neighbor" technique to identify semiconductor devices that have similar fingerprints as determined by selected metrics. By way of another example, a comparative analysis may include weights associated with various data objects included in a fingerprint. It is recognized herein that different data objects or combinations of data objects of a fingerprint may have different relevance for predicting failure. For instance, defect and/or test profile data may have, but are not required to have, a higher predictive weight than fabrication profile data. By way of another example, particular combinations of known defect types and known operational conditions may be highly correlated with device failure.

Referring now to FIGS. 1 through 4B, systems and methods for providing a targeted recall based on manufacturing fingerprints are described in greater detail, in accordance with one or more embodiments of the present disclosure.

FIG. 1A is a conceptual view of a system 100 for providing targeted recalls, in accordance with one or more embodiments of the present disclosure. In one embodiment, the system 100 includes a manufacturing fingerprint sub-system 102 for storing and/or analyzing manufacturing fingerprints 104. For example, the manufacturing fingerprint sub-system 102 may compile and store data objects associated with semiconductor dies 106 at various steps along a manufacturing process into a searchable format to form the manufacturing fingerprints 104. By way of another example, upon failure of a failed die 108 (e.g., one of the semiconductor dies 106), the manufacturing fingerprint sub-system 102 may analyze stored manufacturing fingerprints 104 to identify a subset of semiconductor dies 106 as at-risk dies 110 that have similar manufacturing fingerprints 104 to the failed die 108. Accordingly, the at-risk dies 110 may be sufficiently likely to fail under similar operating conditions as the failed die 108 to warrant a recall.

In another embodiment, the manufacturing fingerprint sub-system 102 includes one or more processors 112 configured to execute program instructions maintained on a memory medium 114. In this regard, the one or more processors 112 of manufacturing fingerprint sub-system 102 may execute any of the various process steps described throughout the present disclosure. The one or more processors 112 of a manufacturing fingerprint sub-system 102 may include any processing element known in the art. In this sense, the one or more processors 112 may include any microprocessor-type device configured to execute algorithms and/or instructions. In one embodiment, the one or more processors 112 may consist of a desktop computer, mainframe computer system, workstation, image computer, parallel processor, or any other computer system (e.g., networked computer) configured to execute a program configured to operate the system 100, as described throughout the present disclosure. It is further recognized that the term "processor" may be broadly defined to encompass any device having one or more processing elements, which execute program instructions from a non-transitory memory medium 114.

The memory medium 114 may include any storage medium known in the art suitable for storing program instructions executable by the associated one or more processors 112. For example, the memory medium 114 may include a non-transitory memory medium. By way of another example, the memory medium 114 may include, but is not limited to, a read-only memory (ROM), a random-access memory (RAM), a magnetic or optical memory device (e.g., disk), a magnetic tape, a solid-state drive and the like. It is further noted that memory medium 114 may be housed in a common controller housing with the one or more processors 112. In one embodiment, the memory medium 114 may be located remotely with respect to the physical location of the one or more processors 112. For instance, the one or more processors 112 of the manufacturing fingerprint sub-system 102 may access a remote memory (e.g., server), accessible through a network (e.g., internet, intranet and the like). Therefore, the above description should not be interpreted as a limitation on the present invention but merely an illustration.

In another embodiment, the system 100 includes a fabrication sub-system 116 including one or more fabrication tools for manufacturing the semiconductor dies 106 such as, but not limited to, lithography tools, etching tools, polishing tools, dicing tools, or packaging tools. The fabrication sub-system 116 (e.g., any associated fabrication tools) may be communicatively coupled to the manufacturing fingerprint sub-system 102 to provide fabrication information associated with the semiconductor dies 106. In this regard, manufacturing fingerprints 104 stored by the manufacturing fingerprint sub-system 102 may include fabrication profile data including information about and/or from the fabrication sub-system 116. For example, fabrication profile data may include, but is not limited to, a fabrication facility, a fabrication line within a fabrication facility, or fabrication tools used at various manufacturing steps. By way of another example, fabrication profile data may include wafer and/or die-specific information such as, but not limited to, a lot identifier, a wafer identifier, a die identifier, or a position of a die on a wafer.

In another embodiment, the system 100 includes a metrology sub-system 118 including one or more metrology tools for characterizing and/or screening semiconductor dies 106 at various steps of the manufacturing process. The metrology sub-system 118 may include any type of metrology tool suitable for any type of metrology and/or inspection measurements at any point of a manufacturing process.

For example, the metrology sub-system 118 may include metrology tools to characterize one or more aspects of deposited films and/or fabricated features. Accordingly, the manufacturing fingerprints 104 may include in-line measurement profiles associated with the metrology results at one or more process steps.

The metrology sub-system 118 may include any type of metrology tool known in the art. In one instance, the metrology sub-system 118 includes a wafer metrology tool to characterize aspects of bare wafers and/or unpatterned films such as, but not limited to, wafer thickness, wafer flatness, film thickness, film flatness, refractive index, or stress. In another instance, the metrology sub-system 118 includes a metrology tool to measure aspects of fabricated features such as, but not limited to, size, critical dimension (CD), shape, orientation, or line roughness. In another instance, the metrology sub-system 118 includes an overlay metrology tool to measure the relative registration positions between features fabricated on different layers of the semiconductor dies 106.

By way of another example, the metrology sub-system 118 may include inspection tools for identifying and/or characterizing defects such as, but not limited to, contaminants or fabrication defects. Accordingly, the manufacturing fingerprints 104 may include the inspection results at one or more process steps.

The metrology sub-system 118 may include any type of inspection tool known in the art. In one instance, the metrology sub-system 118 includes inspection tools to characterize deviations of fabricated features from design specifications such as, but not limited to, critical dimension (CD) errors, undesired connections between components (e.g., electrical shorts), undesired gaps in components, line roughness errors, shape deviations (e.g., rounded corners), or the like. In this regard, the manufacturing fingerprints 104 may include in-line measurement profiles of the semiconductor dies 106 associated with inspection results (e.g., known defects and/or variations of fabricated features from target values) at multiple stages of the manufacturing process. In another embodiment, the metrology sub-system 118 includes inspection tools to detect contaminants such as, but not limited to, undesired materials deposited on the semiconductor dies 106 or manufacturing defects (e.g., scratches during a polishing step, pits, voids, or the like).

By way of another example, the metrology sub-system 118 may include package inspection and/or testing tools to interrogate the functionality and/or connectivity of packaged semiconductor dies 106. Accordingly, the manufacturing fingerprints 104 may include the testing results at one or more process steps such as, but not limited to, a dicing step in which a wafer is diced into individual dies or a packaging step in which dies are integrated into a chip (e.g., with electrical leads, external supports, encasements, or the like) suitable for integration into additional components.

The metrology sub-system 118 may include any type of package testing tool known in the art. In one instance, the metrology sub-system 118 includes testing tools that may characterize the electrical and/or mechanical connections of packaged semiconductor dies 106. In one instance, the metrology sub-system 118 includes burn-in testing equipment in which the performance of packaged semiconductor dies 106 tested under a variety of operational conditions such as, but not limited to, temperatures, voltages, electrical currents, or mechanical stresses.

Metrology tools associated with the metrology sub-system 118 may include any combination of metrology system known in the art such as, but not limited to, optical metrology systems (e.g., light-based metrology systems), particle-based metrology systems, or probe-based systems.

In one embodiment, the metrology sub-system 118 may include optical metrology tools based on illuminating the semiconductor dies 106 with light and/or collecting light emanating from the semiconductor dies 106.

Figure 1B:
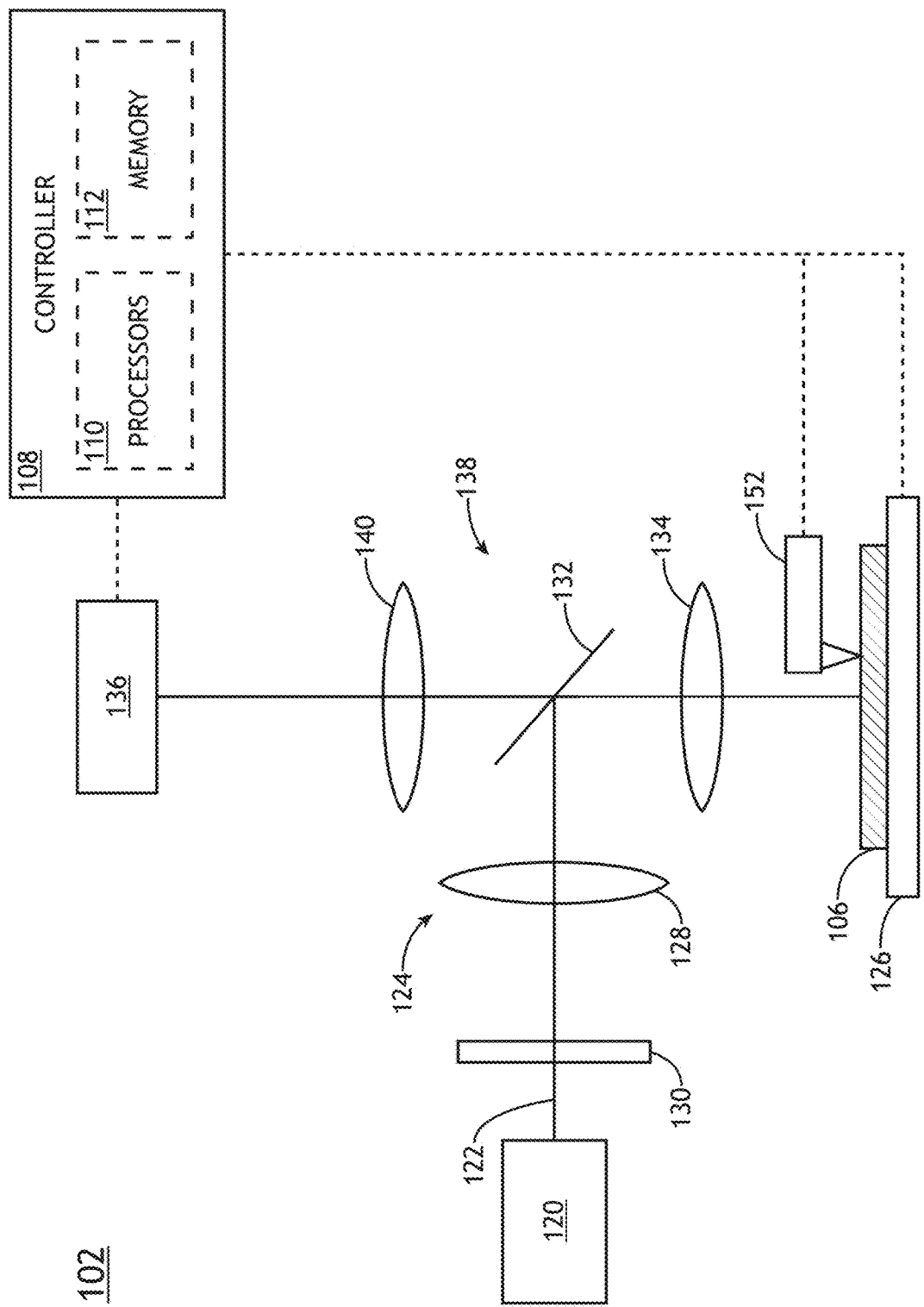
FIG. 1B is a conceptual view illustrating the metrology sub-system, in accordance with one or more embodiments of the present disclosure.

FIG. 1B is a conceptual view illustrating the metrology sub-system 118, in accordance with one or more embodiments of the present disclosure. For example, FIG. 1B may represent, but is not limited to representing, an optical metrology tool.

In one embodiment, the metrology sub-system 118 includes a metrology illumination source 120 to generate a metrology illumination beam 122. The metrology illumination beam 122 may include beam of electromagnetic radiation or a particle beam. For example, the metrology illumination beam 122 may include one or more selected wavelengths of electromagnetic radiation including, but not limited to, X-ray radiation, ultraviolet (UV) radiation, visible radiation, or infrared (IR) radiation. By way of another example, the metrology illumination beam 122 may include a beam of electrons, ions, neutral particles, or the like.

In another embodiment, the metrology illumination source 120 directs the metrology illumination beam 122 via an illumination pathway 124 to a semiconductor die 106 disposed on a sample stage 126. The illumination pathway 124 may include one or more illumination pathway lenses 128. Further, the illumination pathway 124 may include one or more additional optical components 130 suitable for modifying and/or conditioning the metrology illumination beam 122. For example, the one or more optical components 130 may include, but are not limited to, one or more polarizers, one or more filters, one or more beam splitters, one or more diffusers, one or more homogenizers, one or more apodizers, or one or more beam shapers.

In one embodiment, the illumination pathway 124 includes a beamsplitter 132. In another embodiment, the metrology sub-system 118 includes an objective lens 134 to focus the metrology illumination beam 122 onto the semiconductor die 106.

In another embodiment, the metrology sub-system 118 includes one or more detectors 136 configured to capture radiation emanating from the semiconductor die 106 through a collection pathway 138. The collection pathway 138 may include, but is not limited to, one or more collection pathway lenses 140 for collecting radiation from the semiconductor die 106. For example, a detector 136 may receive radiation reflected or scattered (e.g., via specular reflection, diffuse reflection, and the like) from the semiconductor die 106 via one or more collection pathway lenses 140. By way of another example, a detector 136 may receive radiation generated by the semiconductor die 106 (e.g., luminescence associated with absorption of the metrology illumination beam 122, or the like). By way of another example, a detector 136 may receive one or more diffracted orders of radiation from the semiconductor die 106 (e.g., 0-order diffraction, ±1 order diffraction, ±2 order diffraction, and the like).

The detector 136 may include any type of detector known in the art suitable for measuring radiation received from the semiconductor die 106. For example, a detector 136 may include, but is not limited to, a CCD detector, a TDI detector, a photomultiplier tube (PMT), an avalanche photodiode (APD), or the like. By way of another example, a detector 136 may include a spectroscopic detector suitable for identifying wavelengths of radiation emanating from the semiconductor die 106. By way of another example, a detector 136 may include a particle detector suitable for detecting particles (e.g., secondary electrons, backscattered electrons, or the like) emanating from the semiconductor die 106 in response to the metrology illumination beam 122. Further, the metrology sub-system 118 may include multiple detectors 136 (e.g. associated with multiple beam paths generated by one or more beamsplitters) to facilitate multiple metrology measurements by the metrology sub-system 118.

By way of another example, the metrology sub-system 118 may include particle-based metrology tools based on illuminating the semiconductor dies 106 with a particle beam (e.g., an electron beam, an ion beam, or the like) and/or collecting particle-based radiation from the semiconductor dies 106. For instance, particle-based metrology tools may include, but are not limited to, a scanning electron microscope (SEM) or a focused ion beam (FIB) system.

Figure 1C:
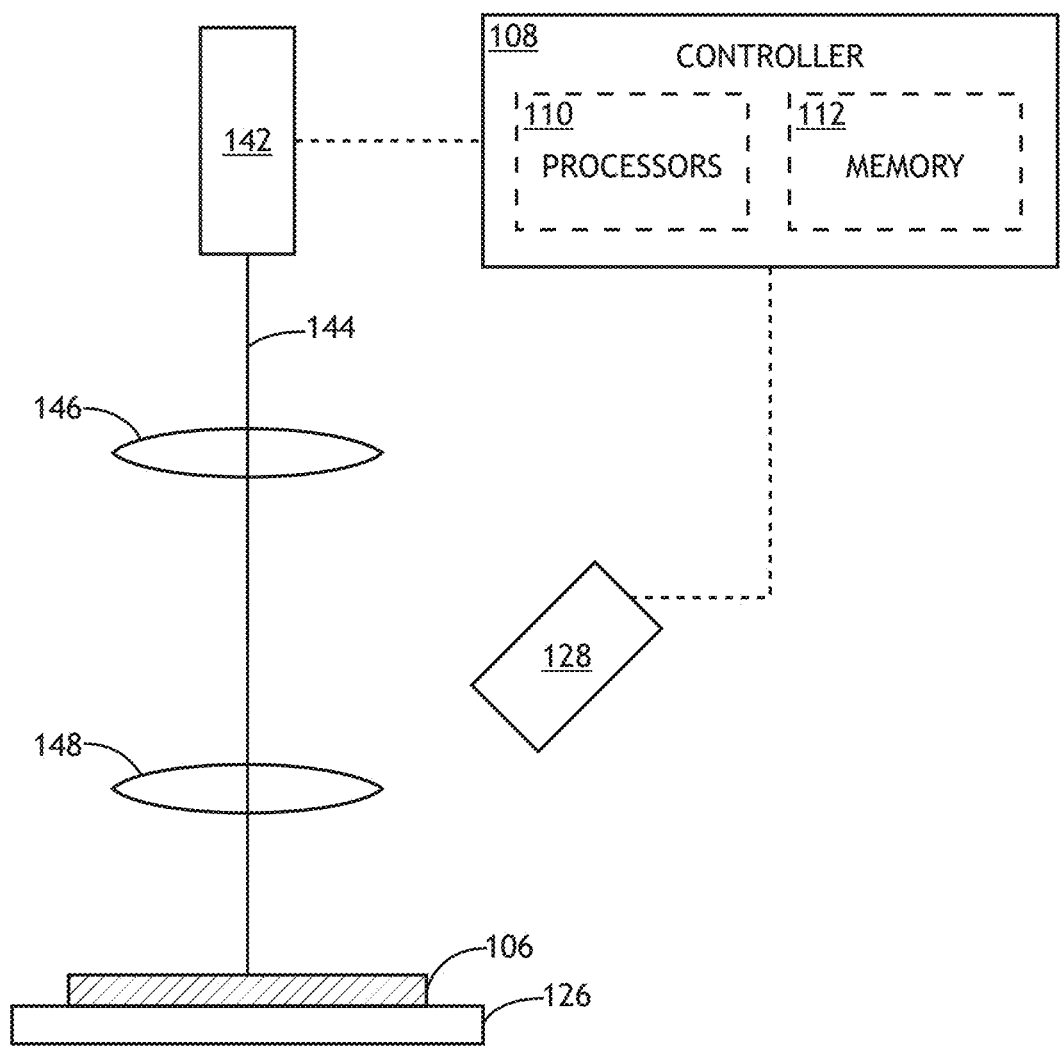
FIG. 1C is a conceptual view illustrating a particle-based metrology sub-system, in accordance with one or more embodiments of the present disclosure.

FIG. 1C is a conceptual view illustrating a particle-based metrology sub-system 118, in accordance with one or more embodiments of the present disclosure.

In one embodiment, the metrology sub-system 118 includes a particle source 142 (e.g., an electron beam source, an ion beam source, or the like) to generate a particle beam 144 (e.g., an electron beam, a particle beam, or the like). The particle source 142 may include any particle source known in the art suitable for generating a particle beam 144. For example, the particle source 142 may include, but is not limited to, an electron gun or an ion gun. In another embodiment, the particle source 142 is configured to provide a particle beam with a tunable energy. For example, a particle source 142 including an electron source may, but is not limited to, provide an accelerating voltage in the range of 0.1 kV to 30 kV. As another example, a particle source 142 including an ion source may, but is not required to, provide an ion beam with an energy in the range of 1 to 50 keV.

In another embodiment, the metrology sub-system 118 includes one or more particle focusing elements 146. For example, the one or more particle focusing elements 146 may include, but are not limited to, a single particle focusing element or one or more particle focusing elements forming a compound system. In another embodiment, the one or more particle focusing elements 146 include a particle objective lens 148 configured to direct the particle beam 144 to a semiconductor die 106 located on a sample stage 126. Further, the one or more particle source 142 may include any type of electron lenses known in the art including, but not limited to, electrostatic, magnetic, uni-potential, or double-potential lenses.

In one embodiment, the metrology sub-system 118 includes one or more particle focusing elements (e.g., illumination pathway lenses 128, or the like) arranged as a single focusing element or a compound focusing element. For example, the one or more particle focusing elements may include, but are not limited to, a single particle focusing element or one or more particle focusing elements forming a compound system suitable for directing the metrology illumination beam 122 to the semiconductor die 106.

In another embodiment, the metrology sub-system 118 may include one or more offset detectors 136 to image or otherwise detect particles and/or electromagnetic radiation emanating from the semiconductor die 106. For example, the detector 136 may include an electron collector (e.g., a secondary electron collector, a backscattered electron detector, or the like). By way of another example, the detector 136 may include a photon detector (e.g., a photodetector, an x-ray detector, a scintillating element coupled to photomultiplier tube (PMT) detector, or the like) for detecting electrons and/or photons from the sample surface.

A particle-based metrology tool may include one or more columns to provide multiple parallel measurements. For example, FIG. 1C may represent, but is not limited to representing, a single column 150 of a particle-based metrology tool. The metrology sub-system 118 may include any number of columns 150. Further, a metrology sub-system 118 including multiple columns 150 may include a single metrology illumination source 120 for the columns 150 or a dedicated metrology illumination source 120 for one or more columns 150.

Further, metrology tools associated with the metrology sub-system 118 (e.g., an optical metrology system, a particle-based metrology system, or the like) may operate in imaging or non-imaging modes. For example, an image-based metrology tool may generate images of semiconductor dies 106 by either imaging a selected field of view with a lens or scanning an illumination beam (e.g., a light beam, a particle beam, or the like) across a device under test to build up an image point-by-point.

By way of another example, the metrology sub-system 118 may include probe-based metrology tools including source and/or collection probes. For instance, a probe-based metrology tool may include probes to supply an electrical voltage and/or a current (e.g., to electrical pads) as well as probes to measure the voltage and/or current at selected portions of the circuits (e.g., at electrical pads, between selected components, or the like). Additionally, it is recognized herein that a probe-based metrology tool may have any type of probe known in the art such as, but not limited to, mechanical probes intended to physically contact a device under test or contactless probes. In one instance, a probe-based metrology tool may utilize a charged particle beam to induce a voltage and/or a current within a device.

Measurement probes may be utilized by a stand-alone probe-based metrology system or may be integrated into other metrology systems such as, but not limited to, optical metrology systems or particle-based metrology systems. In one embodiment, as illustrated in FIG. 1B, one or more measurement probes 152 are integrated into an imaging optical metrology system. For example, the optical metrology system may be configured as an imaging system such that the positions of the one or more measurement probes 152 on the semiconductor dies 106 may be visible to facilitate alignment (e.g., alignment of the measurement probes 152 to contact pads, or the like).

In another embodiment, the system 100 includes a failure analysis sub-system 154 including one or more metrology and/or testing tools for determining failure mechanisms associated with a failed die 108. For example, the failure analysis sub-system 154 may include, but is not required to include, any of the metrology tools of the metrology sub-system 118 (e.g., inspection tools, probe-based tools, or the like). Accordingly, the failure analysis sub-system 154 may interrogate a failed die 108 using any technique known in the art such as, but not limited to, an electrical trace test to characterize the electrical connectivity between selected components, an impedance test to determine the frequency response of the failed die 108 between selected components, or imaging various portions of the failed die 108 to identify points of failure, or analysis of external sources of information (e.g., accident reports, logs, or the like).

In one embodiment, the failure analysis sub-system 154 may link a failure mechanism to one or more elements of a manufacturing fingerprint 104. For example, the failure may be linked to known characteristics of the failed die 108 such as, but not limited to, physical, electrical, mechanical, optical, or chemical characteristics of fabricated features. Accordingly, the failure analysis sub-system 154 may identify one or more components of the manufacturing fingerprint 104 of the failed die 108 (e.g., an in-line measurement, a package characterization measurement, a burn-in test), or the like that may have contributed to the failure mechanism. Accordingly, the manufacturing fingerprint sub-system 102 may identify at-risk dies 110 having similar components of the manufacturing fingerprints 104 linked to the failure mechanism.

It may be the case that upon a device failure, a failure mechanism associated with a failed die 108 may not be known. For example, it may be the case that the failed die 108 is sufficiently damaged that a failure mechanism may not be determined within a desired confidence level. By way of another example, the nature of failure may not be determined within a desired confidence level. In one embodiment, one or more at-risk dies 110 are determined based generally on the manufacturing fingerprint 104 of the failed die 108 without special consideration of the failure mechanism.

In another embodiment, the manufacturing fingerprint sub-system 102 generates manufacturing fingerprints 104 for semiconductor dies 106 based on data generated at multiple points along a manufacturing process from equipment such as, but not limited to, the fabrication sub-system 116, the metrology sub-system 118, or the failure analysis sub-system 154. For example, the manufacturing fingerprint sub-system 102 may store manufacturing fingerprints 104 associated with each semiconductor die 106 in the memory medium 114. Further, the manufacturing fingerprints 104 may be referenced to the semiconductor dies 106 using any technique known in the art. In one embodiment, each semiconductor die 106 is given a unique electronic chip identifier (ECID). Accordingly, the manufacturing fingerprints 104 and the associated data therein may be referenced to the ECIDs.

In another embodiment, the manufacturing fingerprints 104 are stored in a searchable format such that the various data objects (e.g., fabrication profiles, defect profiles, testing profiles, or the like) may be individually accessible for comparison with corresponding data objects of the manufacturing fingerprint 104 of the failed die 108. Further, the manufacturing fingerprint sub-system 102 may include any framework suitable for storing, accessing, analyzing, and/or viewing the manufacturing fingerprints 104 or analysis results. For example, the fabrication sub-system 116 may include, but is not limited to, a data framework (e.g., a big data framework or the like) such as, but not limited to, Apache Hadoop, Apache Spark, Apache Storm, or Google BigQuery. In this regard, the manufacturing fingerprint sub-system 102 may implement any combination of data processing schemes such as, but not limited to, batch processing or stream processing.

Further, the manufacturing fingerprint sub-system 102 may include a filesystem for storing the manufacturing fingerprints 104 such as, but not limited to, the Apache Hadoop Distributed File System (HDFS), a Ceph Filesystem, a Lustre filesystem. Further, the manufacturing fingerprint sub-system 102 may include data analysis and/or data mining models suitable for operating on the stored manufacturing fingerprints 104 such as, but not limited to, a MapReduce framework (e.g., Apache MapReduce, Google MapReduce, Pachyderm MapReduce, or the like), Apache Tez, Apache Ignite, Apache PIG, JAQL, or Apache Flink.

The manufacturing fingerprint sub-system 102 may store the manufacturing fingerprints 104 (e.g., data objects associated with semiconductor dies 106 from the various steps along the manufacturing process) with any level of structure. Further, manufacturing fingerprints 104 may include data having different levels of structure. For example, the manufacturing fingerprints 104, or portions thereof, may be stored as unstructured, semi-structured, or structured data. However, it is recognized herein that data may generally have various levels of structure or organization such that the labels structured data, semi-structured data, unstructured data, and the like may represent general locations on a spectrum describing the amount of structure within a given dataset. Accordingly, even unstructured data may exhibit some amount of organization or structure.

For example, manufacturing fingerprints 104, or portions thereof, may include structured or semi-structured data in which information may be organized into a defined series of organizational labels (e.g., identifying information, defectivity profiles at a given processing step, test data at a given packaging step, or the like). In this regard, the data structure may facilitate comparisons between manufacturing fingerprints 104 and identify similarities and differences between manufacturing fingerprints 104 across different organizational labels. Further, it is recognized herein that not all semiconductor dies 106 undergo the same series of processing steps, metrology steps, and/or testing steps such that manufacturing fingerprints 104 of different semiconductor dies 106 may include data associated with different defined organization structures. However, it may be the case that semiconductor dies 106 associated with a particular semiconductor device may have data within common organizational labels. By way of another example, manufacturing fingerprints 104, or portions thereof, may be stored as unstructured data. In this regard, the manufacturing fingerprints 104 may include information that may not fit into defined organizational labels such as, but not limited to, special circumstances or issues encountered during manufacturing.

The manufacturing fingerprint sub-system 102 may store the manufacturing fingerprints 104, or portions thereof, in any type of database storage framework known in the art. For example, structured data associated with manufacturing fingerprints 104 may be, but are not required to be, stored in a relational infrastructure (e.g., a relational database, or the like) such as, but not limited to, Apache Hive, Google BigQuery, Apache Tajo, or Apache MRQL. By way of another example, semi-structured data associated with manufacturing fingerprints 104 may be, but are not required to be, stored in a NoSQL database of any type such as, but not limited to, a document data model, a stream data model, a key-value data model, or a graph data model. For instance, semi-structured data may be stored in any type of semi-structured data infrastructure such as, but not limited to, Apache Cassandra, Apache HBase, Google BigTable, Hypertable, or Apache Kudu. By way of another example, unstructured data may be stored in any searchable format.

The manufacturing fingerprints 104 may further be organized into a single searchable dataset or distributed within any number of separate datasets. For example, a single dataset including all known manufacturing fingerprints 104 may facilitate correlations between many different semiconductor dies 106 and may identify at-risk dies 110 based on any available data. In another embodiment, the manufacturing fingerprints 104 are divided across multiple datasets that may be searched independently.

For example, it may be desirable to limit the size of a given dataset to promote efficient searching and useful correlations. Accordingly, manufacturing fingerprints 104 may be stored in one or more datasets based on any type of organizational scheme such as, but not limited to, time of manufacture, type of semiconductor device (e.g., memory chips, general processing chips, video processing chips, or the like), or expected operational environment (e.g., personal electronics, automotive, avionics, or the like).

By way of another example, data objects associated with the manufacturing fingerprints 104 may be distributed into multiple datasets based on the level of structure within the data. For example, it may be the case that the organizational infrastructure of the data objects within the manufacturing fingerprints 104 may guide the availability and/or efficiency of algorithms for searching, mining, and/or analyzing the associated data objects. Accordingly, at-risk dies 110 may be identified based on multiple queries of different datasets associated with portions of the manufacturing fingerprints 104 having different levels of structure.

By way of another example, the manufacturing fingerprints 104 may be distributed into multiple datasets based on whether the associated data objects are determined to be outliers based on metrology data (e.g., from the metrology sub-system 118) at one or more processing steps. It is recognized herein that metrology data associated with semiconductor dies 106 at any given processing step deemed to be within a selected quality tolerance may typically be characterized by a distribution and/or a clustering of values and that some semiconductor dies 106 may exhibit metrology measurements outside of the distribution of values (e.g., outliers), yet still be within the selected quality tolerance. However, it may be the case that semiconductor dies 106 exhibiting outlier data associated with one or more metrology measurements within the selected quality tolerance may be more susceptible to failure than semiconductor dies 106 within the distribution. Accordingly, the manufacturing fingerprints 104 associated with at-risk dies 110 with outlier data at one or more processing steps may be, but are not required to be, stored in a common dataset.

Further, outlier data may be identified using any method known in the art. For example, outlier data may be identified using a part average testing (PAT) analysis. In one embodiment, the system 100 performs a static PAT (S-PAT) analysis. In this regard, metrology data is generated for a series of semiconductor dies 106 (typically, though not necessarily, from different lots) and statistically analyzed to determine a distribution of the metrology data within selected quality tolerances (e.g., selected upper and lower limits for a particular metrology measurement). For instance, a mean and standard deviation may be generated for the metrology data. From the statistical analysis, PAT limits may be generated to identify outlier metrology data. For instance, a PAT limit for a Gaussian distribution of metrology data may be, but is not required to be, a deviation from the mean of greater 6 standard deviations (e.g., $\mu+6\sigma$). Accordingly, metrology data for semiconductor dies 106 obtained during fabrication may be compared to the PAT limits to determine the outliers. Further, the PAT data may be used to screen semiconductor dies 106 to limit the distribution of semiconductor dies 106 including outlier data and/or may be incorporated into the manufacturing fingerprints 104 of semiconductor dies 106 to be deployed.

The system 100 may perform a PAT analysis using any combination of components such as, but not limited to, the fabrication sub-system 116, the metrology sub-system 118, the manufacturing fingerprint sub-system 102, or an additional sub-system (not shown). In one embodiment, a PAT analysis is performed by the metrology sub-system 118 and the resulting data is provided to the manufacturing fingerprint sub-system 102 for incorporation into the manufacturing fingerprints 104. In another embodiment, the manufacturing fingerprint sub-system 102 receives metrology data from the metrology sub-system 118 and performs a PAT analysis for inclusion into the manufacturing fingerprints 104. Further, the system 100 may perform any combination of PAT analysis variants for the determination of outliers. In one embodiment, the system 100 performs in-line PAT (I-PAT) based on in-line inspection and/or metrology data during fabrication. I-PAT is generally described in U.S. Patent Application No. 62/475,749 titled "Inline Parts Average Testing (I-PAT) Methodology for Latent Reliability Defect Detection" and filed on Mar. 23, 2017, which is incorporated herein by reference in its entirety. In another embodiment, the system 100 performs dynamic PAT (D-PAT) based on generating statistical PAT limits using rolling data sets. In another embodiment, the system 100 performs parametric PAT (P-PAT) based on parametric data. In another embodiment, the system 100 performs geographical PAT (G-PAT) based on clustering of metrology data based on geographic (e.g., location) data of measurements on a wafer.

The manufacturing fingerprint sub-system 102 may include various interfaces to access the manufacturing fingerprints 104 and/or carry out the analysis. For example, the manufacturing fingerprint sub-system 102 may include a local interface (e.g., a computing device on a local wired or wireless network) to provide queries (e.g., to identify at-risk dies 110 having manufacturing fingerprints 104 similar to that of a failed die 108) and view the associated results. In this regard, access to the manufacturing fingerprints 104 may be tightly controlled to facilitate enhanced security and/or access control with respect to the datasets. By way of another example, the manufacturing fingerprint sub-system 102 may provide a remote interface such that one or more remote computing device may access the stored manufacturing fingerprints 104, provide queries, and/or view query results. For instance, the remote interface may include, but is not limited to, a web portal (e.g., viewable via a browser or an application on any suitable device), a virtual private network (VPN), or the like. Further, the remote interface may include any type of security mechanisms known in the art such as, but not limited to, the Advanced Encryption Standard (AES), Twofish, Blowfish, or the like.

In another embodiment, the manufacturing fingerprint sub-system 102 identifies a subset of the semiconductor dies 106 having manufacturing fingerprints 104 similar to that of a failed die 108 (e.g., at-risk dies 110) based on one or more selected similarity metrics. In this regard, the at-risk dies 110 are predicted to be susceptible to failure under similar operating conditions as the failed die 108. Accordingly, a targeted recall may be initiated to include only the at-risk dies 110. For example, a full or partial manufacturing fingerprint 104 of the failed die 108 may be extracted upon a failure. For instance, in the case that a full manufacturing fingerprint 104 of the failed die 108 is stored in the manufacturing fingerprint sub-system 102, the full manufacturing fingerprint 104 may be extracted (e.g., by referencing the ECID, or the like). In another instance, in the case that failed die 108 is unidentifiable (e.g., the printed ECID has been damaged by the failure, or the like), a partial manufacturing fingerprint 104 may be extracted using the failure analysis sub-system 154. By way of a non-limiting example, in the event of an arc-related short, the failure analysis sub-system 154 may identify features having sizes and/or feature separations near a failure point that may have contributed to the arc.

The manufacturing fingerprint sub-system 102 may compare manufacturing fingerprints 104 using any analysis technique known in the art such as, but not limited to, classification, sorting, clustering, outlier detection, signal response metrology, regression analysis, instance-based analysis (e.g., nearest neighbor analysis, or the like), dimensionality reduction (e.g., factor analysis, feature extraction, principal component analysis, or the like) supervised learning (e.g., artificial neural networks, support-vector machines, random forests, or the like), semi-supervised learning (e.g., generative models, or the like), unsupervised learning (e.g., vector quantization, or the like), deep learning, or Bayesian statistics. It is to be understood that the analysis techniques and any associated labels are provided solely for illustrative purposes and are not intended as limiting. For example, the manufacturing fingerprint sub-system 102 may compare manufacturing fingerprints 104 using any machine learning technique known in the art which may include, but is not limited to, any analysis techniques provided herein. It is recognized herein that analysis techniques may be described and/or categorized in a variety of ways. Further, combinations of analysis techniques may be implemented.

Further, the manufacturing fingerprint sub-system 102 may implement the selected analysis technique using any combination of custom-designed tools, commercially-available tools, open-source tool, or modifications thereof such as, but not limited to, Apache Mahout, Waikato Environment for Knowledge Analysis (WEKA), deeplearning4j, Sparkling Water, or Apache SystemML.

In one embodiment, the manufacturing fingerprint sub-system 102 identifies the at-risk dies 110 based at least in part on a nearest neighbor analysis in which the at-risk dies 110 are identified based on selected distance metric. For example, the various data objects associated with the manufacturing fingerprints 104 may be represented in a multidimensional space and the at-risk dies 110 may be selected based on a distance from the failed die 108 based on a selected distance metric. The distance metric may be any type of distance metric known in the art such as, but not limited to, a Euclidean distance.

A nearest neighbor algorithm may be implemented in multiple ways. For example, the manufacturing fingerprint sub-system 102 may identify the at-risk dies 110 based on a fixed nearest neighbor search. In this regard, at-risk dies 110 may be identified as having manufacturing fingerprints 104 within a fixed distance (based on the selected distance metric) from the manufacturing fingerprint 104 of the failed die 108. Accordingly, one or more fixed distances may be provided along with the manufacturing fingerprint 104 of the failed die 108 in a query to identify the at-risk dies 110. By way of another example, the manufacturing fingerprint sub-system 102 may identify the at-risk dies 110 based on a k-nearest neighbor search. In this regard a selected number, k, of nearest neighbors may be identified. Accordingly, one or more values of k may be provided along with the manufacturing fingerprint 104 of the failed die 108 in a query to identify the at-risk dies 110. By way of another example, the manufacturing fingerprint sub-system 102 may identify the at-risk dies 110 based on a k-nearest neighbor search. In this regard a selected number, k, of nearest neighbors may be identified. Accordingly, one or more values of k may be provided along with the manufacturing fingerprint 104 of the failed die 108 in a query to identify the at-risk dies 110. By way of another example, the manufacturing fingerprint sub-system 102 may identify the at-risk dies 110 based on a nearest neighbor distance ratio. In this regard, the relative distances between neighbors is used to determine a threshold to identify nearest neighbors. For example, it is recognized herein that results of nearest neighbor searches may be highly dependent on the threshold settings (e.g., the fixed distance in a fixed-distance method, the number k of nearest neighbors in a k-nearest neighbor method, or the like). Accordingly, it may be the case that a subset of neighbors (e.g., semiconductor dies 106) may be clustered together such that they may be expected to fail under similar conditions, but a given nearest neighbor search may fail to include all neighbor within the cluster. In one instance, additional techniques such as, but not limited to, a nearest neighbor distance ratio or clustering techniques may identify clustered neighbors when at least a portion of the cluster is identified by a nearest-neighbor search.

In some embodiments, data objects within the manufacturing fingerprints 104 may be weighted in any analysis technique based on any selected criteria. It is recognized herein that not all data objects included in a manufacturing fingerprint 104 may be equally relevant when identifying a subset of semiconductor dies 106 expected to fail under similar conditions as a failed die 108. Accordingly, data objects within the manufacturing fingerprints 104 may be weighted during a query based on any selected scheme such as, but not limited to, the organizational label (e.g., a factory ID, a geographical location of the factory, a lot ID, a timeframe of manufacture, a defect profile at a given fabrication step, metrology results at a given fabrication step, a testing profile at a packaging step, a burn-in test profile of completed devices, or the like).

In one embodiment, weights may be assigned to various data objects within the manufacturing fingerprints 104 based on a failure associated with failure of the failed die 108 (e.g., identified with the failure analysis sub-system 154) during a query. For example, a failure mechanism may include a specific defect associated with a specific manufacturing step (e.g., an unintentional short or a bridge between fabricated elements at the specific manufacturing step, an overlay error between fabricated elements on two or more fabricated layers, a deviation of a feature thickness due to an error in polishing during a polishing step, a defect generated during a packing step, or the like). Accordingly, data objects within the manufacturing fingerprints 104 including data from the metrology sub-system 118 that may be linked to the identified defect may be assigned higher weights to facilitate the identification of at-risk dies 110 with similar metrology data.

Similarly, the failure mechanism may be linked to a known excursion or drift of one or more fabrication lines. Accordingly, data objects associated with identifying information (e.g., a factory ID, a lot ID, a time of manufacture or the like) may be assigned higher weights to favor (but not necessarily limit) the identification of semiconductor dies 106 manufactured at the same factory around the same time as at-risk dies 110. For instance, it may be the case that semiconductor dies 106 fabricated in the same lot or additional lots in the same run may have been affected by the excursion. However, it may also be that the excursion only impacted a portion of semiconductor dies 106 (e.g., semiconductor dies 106 of a portion of a given lot or semiconductor dies 106 on specific locations of a wafer, or the like). In this regard, assigning weights to multiple types of organizational labels may facilitate enhanced scrutiny of semiconductor dies 106 fabricated at or around the same time as the failed die 108, but still applying a nuanced analysis based on the metrology data linked to the failure mechanism. Further, the query may be sufficiently broad to encompass semiconductor dies 106 fabricated at other times or locations based on the metrology data linked to the failure mechanism. Accordingly, the system 100 may provide targeted recalls of at-risk dies 110 based on a multi-factor analysis.

By way of another example, weights may be assigned to organizational labels associated with the expected or known operational conditions of the semiconductor dies 106. For example, it may be the case that a given manufacturing defect may only lead to failure under certain operational conditions (e.g., extreme temperatures, pressures, humidity levels, operational cycles, or the like). In this regard, semiconductor dies 106 having similar metrology data to a failed die 108 associated with a failure mechanism, but deployed in operational conditions not expected to trigger the failure mechanism may not be identified as at-risk dies 110 and thus be excepted from a recall.

By way of another example, weights may be assigned to data objects associated with metrology data (e.g., defect profile data, overlay data, testing data, burn-in data, or the like) based on an outlier analysis. As previously described herein, it may be the case that semiconductor dies 106 exhibiting outlier metrology data at one or more process steps that is still deemed to be within a selected quality tolerance may be more susceptible to failure than semiconductor dies 106 without outlier metrology data. In this regard, data objects within the manufacturing fingerprints 104 associated with outlier data may be weighted in any analysis technique (e.g., a nearest neighbor technique, or any selected analysis technique) so as to increase the likelihood of inclusion in a targeted recall, particularly when the associated metrology may be linked to a failure mechanism of the failed die 108.

The manufacturing fingerprint sub-system 102 may provide results of a query in any format or combination of formats such as, but not limited to text, tables, or graphical objects (e.g., graphs, a topographical map showing multi-dimensional relationships between semiconductor dies 106, or the like). Further, the manufacturing fingerprint sub-system 102 may provide multiple sets of at-risk dies 110 for a targeted recall based on different search criteria. For example, the manufacturing fingerprint sub-system 102 may provide sets of at-risk dies 110 based on multiple queries (e.g., multiple analysis techniques, performed with different weights assigned to various data objects within the manufacturing fingerprints 104, performed on different datasets, or the like). By way of another example, the manufacturing fingerprint sub-system 102 may provide sets of at-risk dies 110 based on different confidence levels. In this regard, an operator may enact a targeted recall of selected at-risk dies 110 based on the circumstances (e.g., severity of the failure, projected impact of the recall, or the like).

Figure 2:
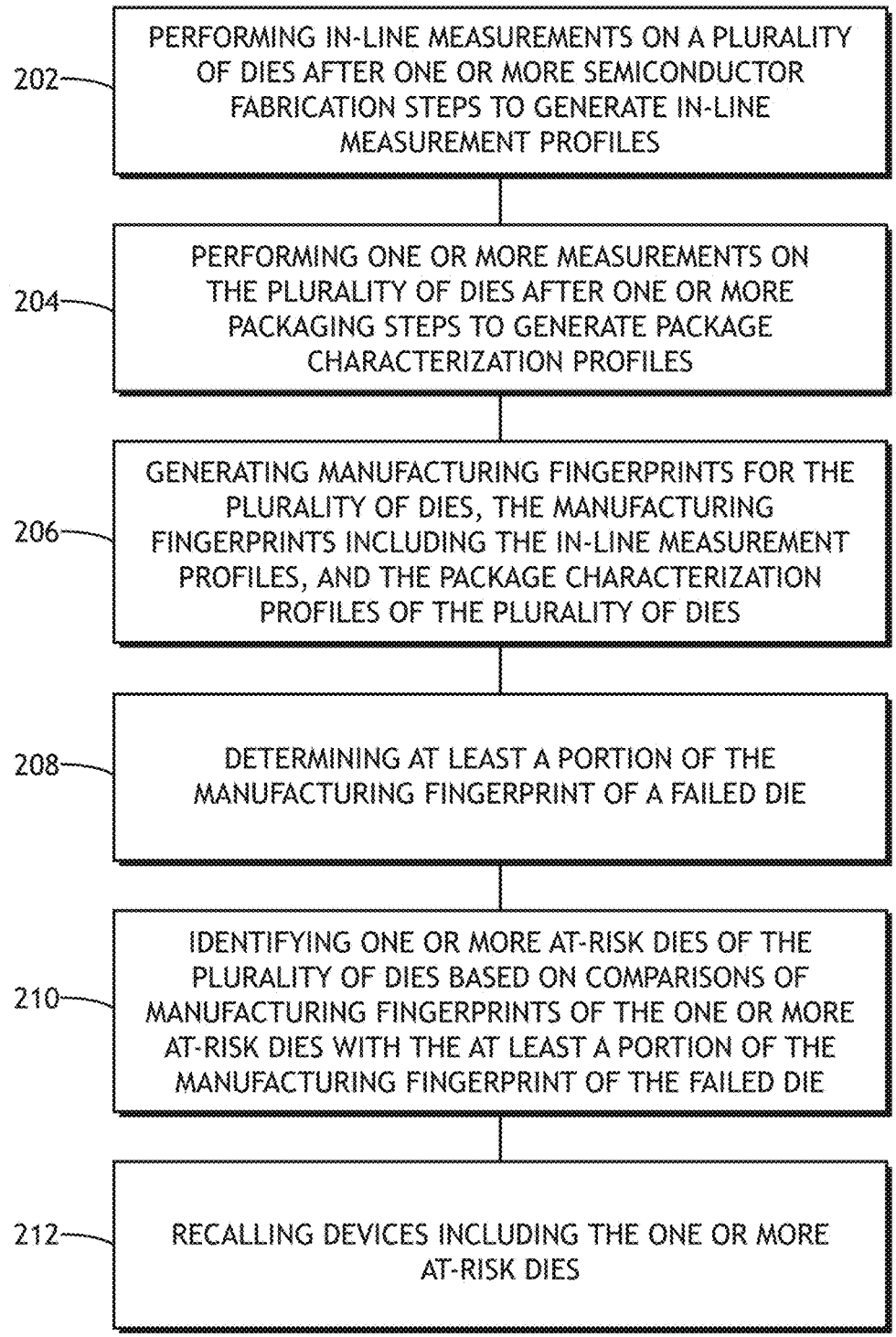
FIG. 2 is a flow diagram illustrating steps performed in a method for performing targeted recalls of semiconductor devices.

FIG. 2 is a flow diagram illustrating steps performed in a method 200 for performing targeted recalls of semiconductor devices. Applicant notes that the embodiments and enabling technologies described previously herein in the context of system 100 should be interpreted to extend to method 200. It is further noted, however, that the method 200 is not limited to the architecture of system 100.

In one embodiment, the method 200 includes a step 202 of performing in-line measurements on a plurality of dies after one or more semiconductor fabrication steps to generate in-line measurement profiles for the plurality of dies. Semiconductor dies (e.g., semiconductor dies 106 illustrated with respect to the system 100) may be characterized by a variety of inline inspection and/or metrology steps at a wafer-stage of the fabrication process. For example, multiple semiconductor dies may be fabricated in parallel on a single wafer.

Figure 3A:
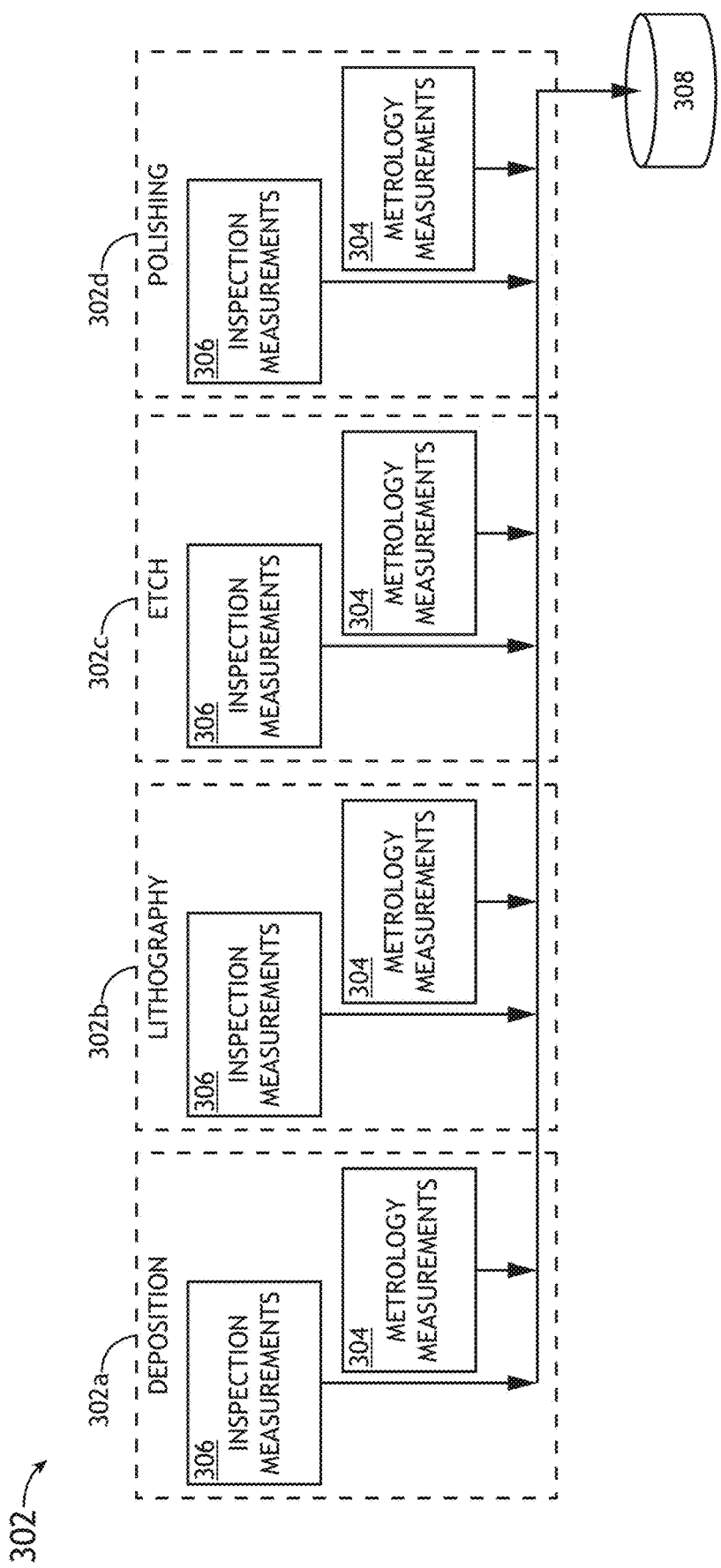
FIG. 3A is a conceptual view of in-line measurements during a wafer stage of a semiconductor fabrication process, in accordance with one or more embodiments of the present disclosure.

FIG. 3A is a conceptual view of in-line measurements during a wafer stage of a semiconductor fabrication process, in accordance with one or more embodiments of the present disclosure.

In one embodiment, a semiconductor die undergoes a series of process steps 302 during a wafer stage of fabrication such as, but not limited to, a deposition step 302*a*, a lithography step 302*b*, an etch step 302*c*, and a polishing step 302*d*. Considering the illustrative example of the system 100, the process steps 302 may be performed using one or more fabrication tools from the fabrication sub-system 116 such as, but not limited to, a deposition chamber, a lithography tool, an etching tool (e.g., a plasma etching tool, a liquid etching tool, or the like), a polishing tool (e.g., a chemical-mechanical planarization (CMP) tool, or the like).

In another embodiment, step 202 includes performing one or more in-line measurements at any number of wafer-stage process steps (e.g., process steps 302 illustrated in FIG. 3A or additional wafer-stage process steps not shown).

For example, the one or more inline measurements may include metrology measurements 304 to characterize one or more aspects of deposited films and/or fabricated features such as, but not limited to, film thickness, refractive index, film stress, critical dimension (CD) and shape metrology measurements of fabricated features, surface profile measurements of fabricated features, or overlay registration measurements between features on two or more layers.

By way of another example, the one or more in-line measurements may include inspection measurements 306 to identify and/or characterize defects such as, but not limited to, fabrication defects or contaminants at any process step. For instance, an inspection tool (e.g., a part of the metrology sub-system 118 of the system 100) may monitor and/or characterize defects associated with unpatterned wafers prior to fabrication (e.g., wafer thickness deviations, wafer stress measurements, scratches, pits, voids, or the like), or deviations of fabrication features on one or more layers from design specifications.

In another embodiment, the in-line measurements may be stored in a memory medium 308 (e.g., the memory medium 114 of the system 100, or the like). In this regard, the in-line measurements may be linked to the corresponding semiconductor dies and incorporated into manufacturing fingerprints 104 (e.g., stored as structured, semi-structured, or unstructured data in a format suitable for analysis).

The in-line measurements may be utilized in any number of ways. In one embodiment, the in-line measurements are used to identify outliers. For example, the method 200 may include identifying outliers using any technique known in the art such as, but not limited to, one or more PAT analysis techniques (e.g., S-PAT, D-PAT, I-PAT, G-PAT, P-PAT, or the like).

Further, the results of an outlier analysis may be utilized in multiple ways. In one embodiment, at least a portion of semiconductor dies including outliers associated with in-line measurements are screened and not deployed (e.g., rejected during fabrication). In another embodiment, at least a portion of semiconductor dies including outliers associated with in-line measurements are deployed (e.g., they are deemed to have passed the quality tolerance), but the outlier data is incorporated into the manufacturing fingerprints 104.

In another embodiment, the method 200 includes a step 204 of performing one or more measurements of the plurality of dies after one or more packaging steps to generate package characterization profiles for the plurality of dies. Semiconductor dies (e.g., semiconductor dies 106 illustrated with respect to the system 100) may be characterized by a variety of inspection and/or metrology steps during or after a packaging stage of fabrication. For example, wafers may be diced (e.g., along scribe lines, or the like) to separate the multiple fabricated semiconductor dies. Accordingly, the semiconductor dies may be individually packaged to provide mechanical supports, enclosures, electrical contacts, and the like. In this regard, the semiconductor dies may be suitable for stand-alone operation or integration into additional systems.

Figure 3B:
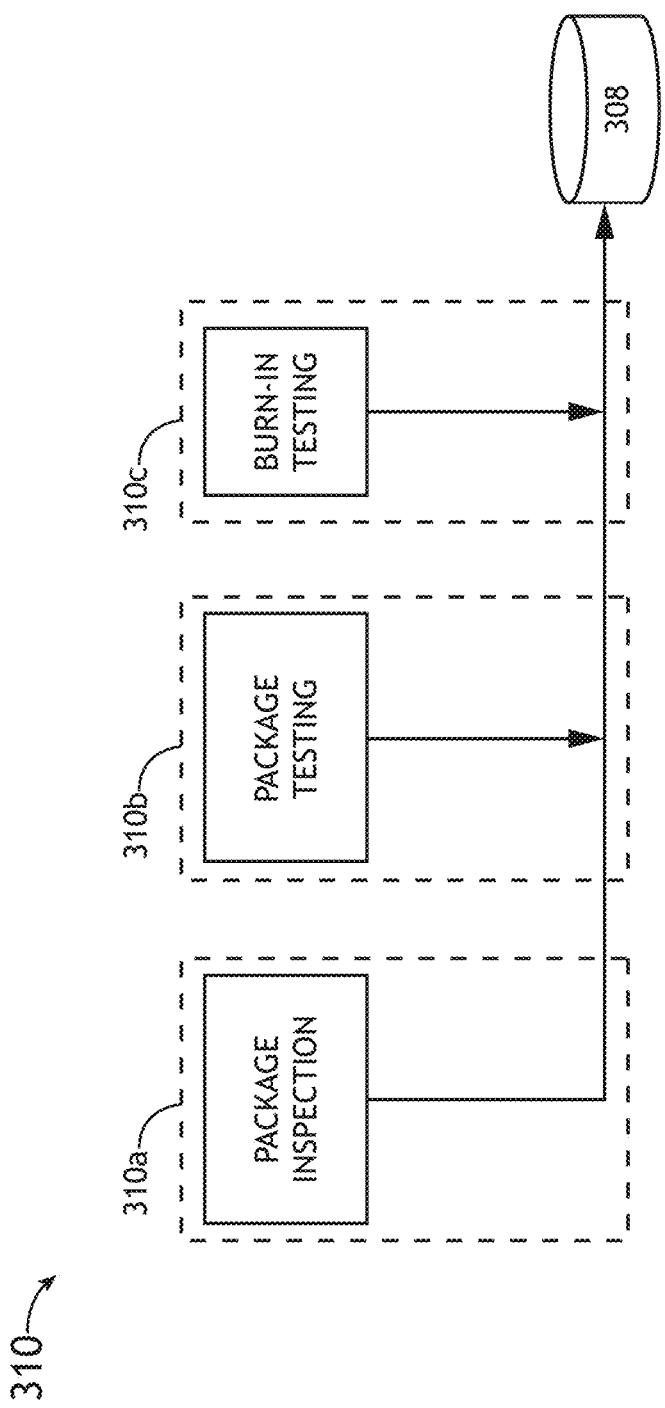
FIG. 3B is a conceptual view of measurements during a package-stage of a semiconductor fabrication process, in accordance with one or more embodiments of the present disclosure.

FIG. 3B is a conceptual view of measurements during a package-stage of a semiconductor fabrication process, in accordance with one or more embodiments of the present disclosure.

In one embodiment, a semiconductor die undergoes a series of process steps 310 during a packaging stage of fabrication such as, but not limited to, a package inspection step 310a, a package testing step 310b, or a burn-in testing step 310c. Considering the illustrative example of the system 100, the process steps 310 may be performed using one or more fabrication tools from the fabrication sub-system 116 such as, but not limited to, a dicing tool, or a packaging tool.

In another embodiment, step 202 includes performing one or more measurements at any number of package-stage process steps (e.g., process steps 310 illustrated in FIG. 3B or additional wafer-stage process steps not shown).

For example, the package inspection steps 310a may characterize one or more aspects of the packaged semiconductor dies. For instance, the package inspection steps 310a may include, but are not limited to, inspection of the diced edges of the semiconductor dies, mechanical and/or electrical tests of attached leads, or the integrity of enclosures. By way of another example, the package testing steps 310b may characterize the performance of packaged semiconductor devices. For instance, the package testing steps 310b may include, but are not limited to, analysis of electrical connections between leads or an analysis of the operational performance of the packaged semiconductor die. By way of another example, the burn-in tests 310c may include operational tests at extreme and/or stressful conditions such as, but not limited to, excessive temperatures, humidity conditions, operating voltages, operating currents, or operating frequencies. In this regard, the burn-in tests 310c may identify semiconductor dies or groups of semiconductor dies that are prone to failure.

In another embodiment, the in-line measurements may be stored in the memory medium 308 (e.g., the memory medium 114 of the system 100, or the like). In this regard, the package-stage measurements may be linked to the corresponding semiconductor dies and incorporated into manufacturing fingerprints 104 (e.g., stored as structured, semi-structured, or unstructured data in a format suitable for analysis).

As described previously herein with respect to the in-line measurements, the package-stage measurements may be utilized in any number of ways. In one embodiment, the package-stage measurements are used to identify outliers. For example, the method 200 may include identifying outliers using any technique known in the art such as, but not limited to, one or more PAT analysis techniques (e.g., S-PAT, D-PAT, I-PAT, G-PAT, P-PAT, or the like).

Further, as described previously herein, the results of an outlier analysis may be utilized in multiple ways. In one embodiment, at least a portion of semiconductor dies including outliers associated with package-stage measurements are screened and not deployed (e.g., rejected during fabrication). In another embodiment, at least a portion of semiconductor dies including outliers associated with package-stage measurements are deployed (e.g., they are deemed to have passed the quality tolerance), but the outlier data is incorporated into the manufacturing fingerprints 104.

In another embodiment, the method 200 includes a step 206 of generating manufacturing fingerprints (e.g., the manufacturing fingerprints 104 of the system 100) for the plurality of dies.

In one embodiment, step 206 includes aggregating data objects associated with the in-line measurement profiles or the package characterization profiles for the semiconductor dies. For example, data objects may be received from the metrology tools that generated the data (e.g., metrology tools associated with the metrology sub-system 118, or the like). By way of another example, stored data objects may be retrieved from a memory device (e.g., the memory medium 114).

The data objects associated with the manufacturing fingerprints may be linked to or otherwise associated with the physical semiconductor dies using any method known in the art. In one embodiment, each semiconductor die is fabricated with a unique electronic chip identifier (ECID) that is visible on or otherwise retrievable from the semiconductor die. In this regard, the manufacturing fingerprint of each semiconductor die may include the associated ECID.

In another embodiment, step 206 includes converting one or more data objects (e.g., data objects associated with the in-line measurement profiles, the package characteristic profiles, or the like) into a format suitable for search and/or comparative analysis (e.g., by a manufacturing fingerprint sub-system 102 of the system 100, or the like). For example, data objects, or portions thereof, associated with the semiconductor dies may be converted into a uniform format suitable for categorization based on selected organizational labels of the manufacturing fingerprints. In this regard, the data objects associated with the manufacturing fingerprints may be organized as structured or semi-structured data.

In one instance, data objects (e.g., metrology data, inspection data, package inspection data, package testing data, burn-in data, or the like) may be converted into an alphanumeric format suitable for storage as structured data (e.g., in a relational database with fixed organizational labels) or semi-structured data (e.g., in a NoSQL database allowing for flexible organizational structure). Data suitable for storage in an alphanumeric format may thus include, but is not limited to, measurement values, statistics associated with multiple features (e.g., average values, standard deviations, variances, or the like), or outlier information (e.g., a deviation of measured values from average values, or the like). Further, the statistical and/or outlier information may be referenced to any selected set of semiconductor dies such as, but not limited to, features on a given semiconductor die, features on a given wafer, features on a given lot, or features from a given fabrication line.

In another instance, at least a portion of the data objects (e.g., metrology data, inspection data, package inspection data, package testing data, burn-in data, or the like) may be stored in a graphical format such as, but not limited to, images or graphs. It is recognized herein that correlations between graphical data may be analyzed using a variety of machine learning techniques. Further, manufacturing fingerprints generated in step 206 may include any combination of data of any type including, but not limited to, alphanumeric and graphical data.

In another embodiment, the manufacturing fingerprints generated in step 206 include fabrication profile data associated with identifying information relevant to the fabrication of the semiconductor dies. For example, fabrication profile data may include a fabrication location such as a fabrication facility, a fabrication line within a fabrication facility, or the like. By way of another example, fabrication profile data may include a fabrication time or time window. By way of another example, fabrication profile data may include granular information relevant to the specific wafer, the specific die on a wafer, the specific location within a die, or the like. For instance, fabrication profile data may include granular information such as, but not limited to, a lot identifier, a wafer identifier, or a die location on a wafer (e.g., in X-Y coordinates, in polar coordinates, or the like).

In another embodiment, the manufacturing fingerprints generated in step 206 include expected or known operational conditions. For example, it may be the case that an expected operational environment (e.g., temperature, pressure, EOS, EDS, or the like) and/or the intended use (e.g., an airline cockpit, an automobile, a consumer electronic device, or the like) may influence the likelihood that a given semiconductor die may fail. Accordingly, semiconductor dies having otherwise similar manufacturing fingerprints may fail in some operational conditions and not others.

In another embodiment, the method 200 includes a step 208 of determining at least a portion of the manufacturing fingerprint of a failed die (e.g., a failed die 108 as illustrated in FIG. 1A, or the like). For example, in the case that a manufacturing fingerprint of the failed die was generated prior to deployment and an ECID of the failed die is known, the manufacturing fingerprint, or a portion thereof, may be retrieved from storage (e.g., from memory medium 114, or the like).

In another embodiment, step 208 includes performing one or more metrology and/or testing steps to determine at least a portion of the manufacturing fingerprint of the failed die. For example, in the case that the manufacturing fingerprint of the failed die was not generated prior to deployment, one or more testing or metrology steps may be performed (e.g., with the metrology sub-system 118 and/or the failure analysis sub-system 154 of system 100, or the like) to determine at least a portion of the manufacturing fingerprint of the failed die (e.g., characterize fabricated features on one or more layers of the failed die, or the like).

In another embodiment, step 208 includes identifying one or more failure mechanisms associated with the failed die (e.g., using the failure analysis sub-system 154 of system 100, or the like). Accordingly, step 208 may include interrogating a failed die using any technique known in the art such as, but not limited to, an electrical trace test to characterize the electrical connectivity between selected components, an impedance test to determine the frequency response of the failed die between selected components, or imaging various portions of the failed die to identify points of failure, or analysis of external sources of information (e.g., accident reports, logs, or the like).

Figure 4B:
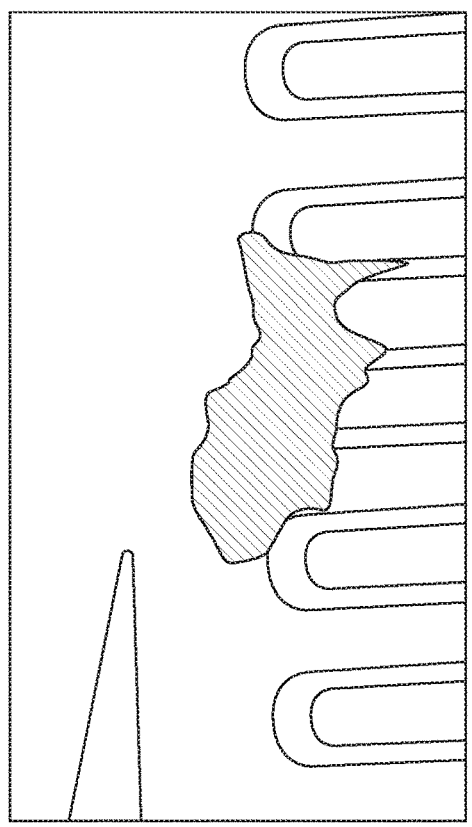
FIG. 4B includes a drawing representative of a particle-beam image indicating damage, in accordance with one or more embodiments of the present disclosure.
Figure 4A:
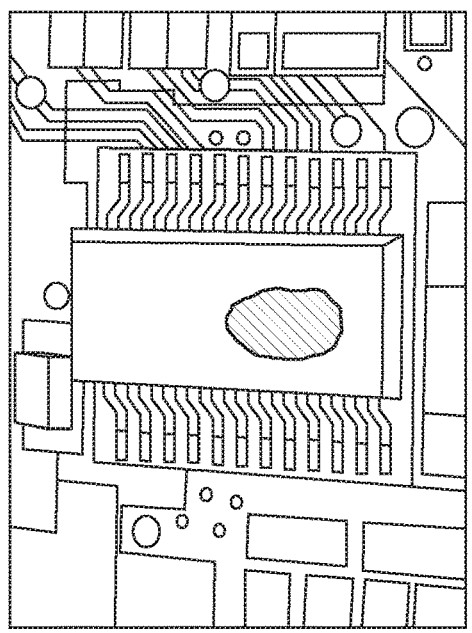
FIG. 4A includes a drawing representative of an optical image of an external enclosure indicating damage, in accordance with one or more embodiments of the present disclosure.

FIGS. 4A and 4B includes drawings illustrating failed dies, in accordance with one or more embodiments of the present disclosure. FIG. 4A includes a drawing 402 representative of an optical image of an external enclosure indicating damage, in accordance with one or more embodiments of the present disclosure. For example, drawing 402 may facilitate identification of the type of failure (e.g., overheating). FIG. 4B includes a drawing 404 representative of a particle-beam image indicating damage, in accordance with one or more embodiments of the present disclosure. For example, drawing 404 may facilitate identification of one or more specific points of failure and/or the failure mechanisms at the specific points of failure. In this regard, elements of the manufacturing fingerprint (e.g., deviations from design specifications, or the like) associated with the points of failure may be identified and used as a basis for the determination of additional at-risk dies 110.

In another embodiment, step 208 may include linking a failure mechanism to one or more elements of a manufacturing fingerprint. For example, the failure may be linked to known characteristics of the failed die 108 such as, but not limited to, physical, electrical, mechanical, optical, or chemical characteristics of fabricated features. Accordingly, step 208 may include identifying one or more components of the manufacturing fingerprint of the failed die (e.g., an in-line measurement, a package characterization measurement, a burn-in test), or the like that may have contributed to the failure mechanism.

In another embodiment, the method 200 includes a step 210 of identifying one or more at-risk dies based on comparisons of manufacturing fingerprints of the one or more at-risk dies with the at least a portion of the manufacturing fingerprint of the failed die. In another embodiment, the method 200 includes a step 212 of recalling devices including the one or more additional dies.

In another embodiment, the step 210 includes identifying a subset of the semiconductor dies 106 having manufacturing fingerprints 104 similar to that of a failed die 108 (e.g., at-risk dies 110) based on one or more selected similarity metrics. In this regard, the at-risk dies 110 are predicted to be susceptible to failure under similar operating conditions as the failed die 108. Accordingly, a targeted recall may be initiated to include only the at-risk dies 110.

The step 210 may include comparing manufacturing fingerprints 104 using any analysis technique known in the art such as, but not limited to, classification, sorting, clustering, outlier detection, signal response metrology, regression analysis, instance-based analysis (e.g., nearest neighbor analysis, or the like), dimensionality reduction (e.g., factor analysis, feature extraction, principal component analysis, or the like) supervised learning (e.g., artificial neural networks, support-vector machines, random forests, or the like), semi-supervised learning (e.g., generative models, or the like), unsupervised learning (e.g., vector quantization, or the like), deep learning, or Bayesian statistics. It is to be understood that the analysis techniques and any associated labels are provided solely for illustrative purposes and are not intended as limiting. For example, the manufacturing fingerprint sub-system 102 may compare manufacturing fingerprints 104 using any machine learning technique known in the art which may include, but is not limited to, any analysis techniques provided herein. It is recognized herein that analysis techniques may be described and/or categorized in a variety of ways. Further, combinations of analysis techniques may be implemented.

In one embodiment, the manufacturing fingerprint sub-system 102 identifies the at-risk dies 110 based at least in part on a nearest neighbor analysis in which the at-risk dies 110 are identified based on selected distance metric. For example, the various data objects associated with the manufacturing fingerprints 104 may be represented in a multidimensional space and the at-risk dies 110 may be selected based on a distance (e.g., a Euclidean distance, or the like) from the failed die 108 based on a selected distance metric.

In some embodiments, step 210 includes identifying at-risk dies based on a weighted analysis of components of the manufacturing fingerprints. It is recognized herein that not all data objects included in a manufacturing fingerprint 104 may be equally relevant when identifying a subset of semiconductor dies 106 expected to fail under similar conditions as a failed die 108. Accordingly, data objects within the manufacturing fingerprints 104 may be weighted during a query based on any selected scheme such as, but not limited to, the organizational label (e.g., a factory ID, a geographical location of the factory, a lot ID, a timeframe of manufacture, a defect profile at a given fabrication step, metrology results at a given fabrication step, a testing profile at a packaging step, a burn-in test profile of completed devices, or the like).

The at-risk dies may be identified based on any type of weighting scheme such as, but not limited to, components of the manufacturing fingerprints linked to a failure mechanism (e.g., determined in step 208, or the like), operational conditions of the set of semiconductor dies with known manufacturing fingerprints that may be similar to the operational conditions of the failed die, or an outlier analysis.

By way of a non-limiting example, a sporadic failure of semiconductor dies in high-profile situations including loss of life and/or property may occur (e.g., associated with semiconductor dies integrated into automobiles, or the like). Upon device failure, the unique ECIDs of failed dies may be identified and the manufacturing fingerprint of the failed dies may be retrieved. A failure analysis may indicate that the failure mechanism is associated with latent manufacturing defects. For instance, the failure analysis may indicate the presence of partial opens at a specific processing layer that may fail upon electrical overstress unique to the operational environment (e.g., associated with integration into an automobile). With this information, the history of the failed dies may be determined and may include, but is not limited to, the fabrication facilities, the lot IDs, the wafer IDs, and the locations of the partial opens on the wafers. Further, in-line measurements associated with metrology and/or inspection measurements, package characterization testing results, and/or burn-in testing results may be identified for the failed die based on the manufacturing fingerprints may be extracted. Accordingly, a targeted recall may identify at-risk dies based on any desired combination and/or weighted combination of the manufacturing fingerprints. For instance, 50 similar dies may be identified as at-risk dies based on the defect profiles (e.g., the presence of the partial opens). Further, location-specific factors such as the fabrication facility, identifiers (e.g., lot IDs, wafer IDs, locations of defects on the wafers, or the like) associated with fabrication similar in time to that of the failed die may be, but are not required to be factored into the analysis. From the 50 similar dies, it may be determined that only 20 of the dies are deployed in similar operational conditions as the failed die such that they may be considered at risk of failure. Accordingly, the 20 dies may be identified as at-risk dies and may be subject to a targeted recall.

The herein described subject matter sometimes illustrates different components contained within, or connected with, other components. It is to be understood that such depicted architectures are merely exemplary, and that in fact many other architectures can be implemented which achieve the same functionality. In a conceptual sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "connected" or "coupled" to each other to achieve the desired functionality, and any two components capable of being so associated can also be viewed as being "couplable" to each other to achieve the desired functionality. Specific examples of couplable include but are not limited to physically interactable and/or physically interacting components and/or wirelessly interactable and/or wirelessly interacting components and/or logically interactable and/or logically interacting components.

It is believed that the present disclosure and many of its attendant advantages will be understood by the foregoing description, and it will be apparent that various changes may be made in the form, construction, and arrangement of the components without departing from the disclosed subject matter or without sacrificing all of its material advantages. The form described is merely explanatory, and it is the intention of the following claims to encompass and include such changes. Furthermore, it is to be understood that the invention is defined by the appended claims.

What is claimed:

1. A system for providing a targeted recall comprising:
    a metrology sub-system for performing in-line measurements on a plurality of dies after one or more semiconductor fabrication steps to generate in-line measurement profiles for the plurality of dies, wherein the metrology sub-system performs one or more measurements of the plurality of dies after one or more packaging steps to generate package characterization profiles for the plurality of dies;
    a failure analysis sub-system for determining at least a portion of a manufacturing fingerprint of a failed die;
    a controller communicatively including one or more processors configured to execute program instructions causing the one or more processors to:
    generate manufacturing fingerprints for the plurality of dies, the manufacturing fingerprints including the in-line measurement profiles received from a metrology sub-system, and package characterization profiles of the plurality of dies received from the metrology sub-system, wherein the manufacturing fingerprints are stored in memory for at least some die transferred through a supply chain, wherein each manufacturing fingerprint is referenced to a unique electronic chip identifier (ECID) for each die of the plurality of dies;
    applying one or more machine learning techniques to compare the manufacturing fingerprint of the failed die to a database of manufacturing fingerprints associated with nearest neighbor die of the failed die to identify one or more at-risk dies of the plurality of dies, wherein the at-risk dies comprise one or more dies of the nearest neighbor dies displaying manufacturing fingerprints indicating a likelihood of failure; and
    direct a targeted recall for the one or more at-risk dies.

2. The system for providing a targeted recall of claim 1, further comprising:
    identifying outlier dies based on at least one of the in-line measurement profiles or the package characterization profiles to generate outlier profiles for the plurality of dies, wherein the manufacturing fingerprints for the plurality of dies include the outlier profiles.

3. The system for providing a targeted recall of claim 2, wherein identifying outlier dies comprises:

identifying outlier dies based on a part average testing technique.

4. The system for providing a targeted recall of claim 3 wherein the part average testing technique comprises:
at least one of an in-line part average testing technique, a dynamic part average testing technique, or a geographic part average testing technique.

5. The system for providing a targeted recall of claim 3, wherein identifying outlier dies based on at least one of the in-line measurement profiles or the package characterization profiles comprises:
identifying outlier dies based on a deviation of at least one of the in-line measurement profiles or the package characterization profiles from average values beyond a selected deviation tolerance.

6. The system for providing a targeted recall of claim 2, wherein at least a portion of the outlier dies are screened prior to deployment.

7. The system for providing a targeted recall of claim 1, wherein identifying one or more at-risk dies of the plurality of dies based on comparisons of manufacturing fingerprints of the plurality of dies with the at least a portion of the manufacturing fingerprint of the failed die comprises:
identifying one or more at-risk dies of the plurality of dies based on a nearest neighbor technique.

8. The system for providing a targeted recall of claim 1, wherein identifying the one or more at-risk dies of the plurality of dies based on comparisons of manufacturing fingerprints of the plurality of dies with the at least a portion of the manufacturing fingerprint of the failed die comprises:
identifying the one or more at-risk dies of the plurality of dies based on correlations of manufacturing fingerprints of the plurality of dies with the at least a portion of the manufacturing fingerprint of the failed die.

9. The system for providing a targeted recall of claim 8, wherein identifying one or more at-risk dies of the plurality of dies based on correlations of manufacturing fingerprints of the plurality of dies with the at least a portion of the manufacturing fingerprint of the failed die comprises:
identifying one or more at-risk dies of the plurality of dies based on weighted correlations of the in-line measurement profiles and the package characterization profiles.

10. The system for providing a targeted recall of claim 9, further comprising:
determining a failure mechanism associated with failure of the failed die;
assigning correlation weights to elements of the manufacturing fingerprints based on the failure mechanism.

11. The system for providing a targeted recall of claim 1, wherein the manufacturing fingerprint further includes fabrication profiles.

12. The system for providing a targeted recall of claim 11, wherein the fabrication profiles comprises:
at least one of an electronic chip identifier (ECID), a fabrication facility, a lot identifier, a wafer identifier, or a wafer location identifier.

13. The system for providing a targeted recall of claim 11, wherein identifying one or more at-risk dies of the plurality of dies based on comparisons of manufacturing fingerprints of the plurality of dies with the at least a portion of the manufacturing fingerprint of the failed die comprises:
identifying one or more at-risk dies of the plurality of dies based on weighted comparisons of the in-line measurement profiles, the package characterization profiles, and the fabrication history profiles of the plurality of dies with respect to the failed die.

14. The system for providing a targeted recall of claim 13, wherein the fabrication history profiles are weighted lower than at least one of the in-line measurement profiles or the package characterization profiles.

15. A method for providing a targeted recall comprising:
performing in-line measurements on a plurality of dies after one or more semiconductor fabrication steps to generate in-line measurement profiles for the plurality of dies;
performing one or more measurements of the plurality of dies after one or more packaging steps to generate package characterization profiles for the plurality of dies;
generating manufacturing fingerprints for the plurality of dies, the manufacturing fingerprints including the in-line measurement profiles, and the package characterization profiles of the plurality of dies, wherein the manufacturing fingerprints are stored in memory for at least some die transferred through a supply chain, wherein each manufacturing fingerprint is referenced to a unique electronic chip identifier (ECID) for each die of the plurality of dies;
determining at least a portion of the manufacturing fingerprint of a failed die of the plurality of dies;
applying one or more machine learning techniques to compare the manufacturing fingerprint of the failed die to a database of manufacturing fingerprints associated with nearest neighbor die of the failed die to identify one or more at-risk dies of the plurality of dies, wherein the at-risk dies comprise one or more dies of the nearest neighbor dies displaying manufacturing fingerprints indicating a likelihood of failure; and
recalling devices including the one or more at-risk dies.

16. The method for providing a targeted recall of claim 15, further comprising:
identifying outlier dies based on at least one of the in-line measurement profiles or the package characterization profiles to generate outlier profiles for the plurality of dies, wherein the manufacturing fingerprints for the plurality of dies include the outlier profiles.

17. The method for providing a targeted recall of claim 16, wherein identifying outlier dies comprises:
identifying outlier dies based on a part average testing technique.

18. The method for providing a targeted recall of claim 17 wherein the part average testing technique comprises:
at least one of an in-line part average testing technique, a dynamic part average testing technique, or a geographic part average testing technique.

19. The method for providing a targeted recall of claim 17, wherein identifying outlier dies based on at least one of the in-line measurement profiles or the package characterization profiles comprises:
identifying outlier dies based on a deviation of at least one of the in-line measurement profiles or the package characterization profiles from average values beyond a selected deviation tolerance.

20. The method for providing a targeted recall of claim 16, wherein at least a portion of the outlier dies are screened prior to deployment.

21. The method for providing a targeted recall of claim 15, wherein identifying one or more at-risk dies of the plurality of dies based on comparisons of manufacturing fingerprints of the plurality of dies with the at least a portion of the manufacturing fingerprint of the failed die comprises:
identifying one or more at-risk dies of the plurality of dies based on a nearest neighbor technique.

22. The method for providing a targeted recall of claim 15, wherein identifying the one or more at-risk dies of the plurality of dies based on comparisons of manufacturing fingerprints of the plurality of dies with the at least a portion of the manufacturing fingerprint of the failed die comprises:
identifying the one or more at-risk dies of the plurality of dies based on correlations of manufacturing fingerprints of the plurality of dies with the at least a portion of the manufacturing fingerprint of the failed die.

23. The method for providing a targeted recall of claim 22, wherein identifying one or more at-risk dies of the plurality of dies based on correlations of manufacturing fingerprints of the plurality of dies with the at least a portion of the manufacturing fingerprint of the failed die comprises:
identifying one or more at-risk dies of the plurality of dies based on weighted correlations of the in-line measurement profiles and the package characterization profiles.

24. The method for providing a targeted recall of claim 23, further comprising:
determining a failure mechanism associated with failure of the failed die;
assigning correlation weights to elements of the manufacturing fingerprints based on the failure mechanism.

25. The method for providing a targeted recall of claim 15, wherein the manufacturing fingerprint further includes fabrication profiles.

26. The method for providing a targeted recall of claim 25, wherein the fabrication profiles comprises:
at least one of an electronic chip identifier (ECID), a fabrication facility, a lot identifier, a wafer identifier, or a wafer location identifier.

27. The method for providing a targeted recall of claim 25, wherein identifying one or more at-risk dies of the plurality of dies based on comparisons of manufacturing fingerprints of the plurality of dies with the at least a portion of the manufacturing fingerprint of the failed die comprises:
identifying one or more at-risk dies of the plurality of dies based on weighted comparisons of the in-line measurement profiles, the package characterization profiles, and the fabrication history profiles of the plurality of dies with respect to the failed die.

28. The method for providing a targeted recall of claim 27, wherein the fabrication history profiles are weighted lower than at least one of the in-line measurement profiles or the package characterization profiles.

29. A system for providing a targeted recall comprising:

a controller communicatively coupled to a metrology sub-system and a failure analysis sub-system, the controller including one or more processors configured to execute program instructions causing the one or more processors to:

generate manufacturing fingerprints for a plurality of dies, the manufacturing fingerprints including in-line measurement profiles of the plurality of dies received from the metrology sub-system based on in-line measurements after one or more semiconductor fabrication steps, the manufacturing fingerprints further including package characterization profiles of the plurality of dies received from the metrology sub-system based on measurements after one or more packaging steps, wherein the manufacturing fingerprints stored in memory for at least some die transferred through a supply chain, wherein each manufacturing fingerprint is referenced to a unique electronic chip identifier (ECID) for each die of the plurality of dies;

applying one or more machine learning techniques to compare the manufacturing fingerprint of the failed die to a database of manufacturing fingerprints associated with nearest neighbor die of the failed die to identify one or more at-risk dies of the plurality of dies, wherein the at-risk dies comprise one or more dies of the nearest neighbor dies displaying manufacturing fingerprints indicating a likelihood of failure; and direct a targeted recall for the one or more at-risk dies.

* * * * *